(12) United States Patent
Liu et al.

(10) Patent No.: US 11,217,708 B2
(45) Date of Patent: Jan. 4, 2022

(54) OPTICAL SENSOR AND METHOD FOR FORMING THE SAME

(71) Applicant: Vanguard International Semiconductor Corporation, Hsinchu (TW)

(72) Inventors: Shih-Hao Liu, Taoyuan (TW); Chung-Ren Lao, Taichung (TW); Chih-Cherng Liao, Jhudong Township (TW); Wu-Hsi Lu, New Taipei (TW); Ming-Cheng Lo, New Taipei (TW); Wei-Lun Chung, Lukang Township (TW); Chih-Wei Lin, Jhubei (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 16/890,736

(22) Filed: Jun. 2, 2020

(65) Prior Publication Data
US 2021/0376171 A1 Dec. 2, 2021

(51) Int. Cl.
*H01L 31/02* (2006.01)
*H01L 31/0216* (2014.01)
(Continued)

(52) U.S. Cl.
CPC .. *H01L 31/02161* (2013.01); *H01L 31/02005* (2013.01); *H01L 31/02366* (2013.01); *H01L 31/035272* (2013.01); *H01L 31/1868* (2013.01)

(58) Field of Classification Search
CPC ......... H01L 31/02161; H01L 31/02005; H01L 31/02366; H01L 31/035272; H01L 31/1868
See application file for complete search history.

(56) References Cited

U.S. PATENT DOCUMENTS

| | | | |
|---|---|---|---|
| 2008/0042177 A1* | 2/2008 | Park | H01L 27/14687 257/294 |
| 2018/0069043 A1* | 3/2018 | Pan | H01L 27/14625 |

(Continued)

FOREIGN PATENT DOCUMENTS

| | | |
|---|---|---|
| TW | I427783 B | 2/2014 |
| TW | 201445670 A | 12/2014 |

(Continued)

*Primary Examiner* — Matthew L Reames
(74) *Attorney, Agent, or Firm* — Birch, Stewart, Kolasch & Birch, LLP (57) ABSTRACT

An optical sensor includes a substrate, a first/second/third well disposed in a sensing region, a deep trench isolation structure, and a passivation layer. The substrate has a first conductivity type and includes the sensing region. The first well has a second conductivity type and a first depth. The second well has the second conductivity type and a second depth. The third well has the first conductivity type and a third depth. The deep trench isolation structure is disposed in the substrate and surrounding the sensing region, wherein the depth of the deep trench isolation structure is greater than the first depth, the first depth is greater than the second depth, and the second depth is greater than the third depth. The passivation layer is disposed over the substrate, wherein the passivation layer includes a plurality of protruding portions disposed directly above the sensing region.

20 Claims, 8 Drawing Sheets

(51) Int. Cl.
*H01L 31/0352* (2006.01)
*H01L 31/18* (2006.01)
*H01L 31/0236* (2006.01)

(56) References Cited

U.S. PATENT DOCUMENTS

2018/0269236 A1* 9/2018 Sasaki ................. H01L 31/1804
2020/0028019 A1* 1/2020 Takimoto .......... H01L 27/14643
2020/0119073 A1* 4/2020 Machida ........... H01L 27/14625

FOREIGN PATENT DOCUMENTS

| TW | I524550 B | 3/2016 |
| TW | 201715699 A | 5/2017 |
| TW | I591766 B | 7/2017 |

* cited by examiner

OPTICAL SENSOR AND METHOD FOR FORMING THE SAME

BACKGROUND

Technical Field

The disclosure relates to an optical element, and more particularly to an optical sensor and a method for forming the same.

Description of the Related Art

An optical sensor (e.g. image sensor) is used to convert an optical image focused on the image sensor into an electrical signal. The image sensor usually includes several groups of light-detecting elements, such as photodiodes, and a light-detecting element is configured to produce an electrical signal corresponding to the intensity of light incident to the light-detecting element. The electrical signal thus produced may be further processed by a signal-processing circuit to display a corresponding image on a monitor or provide information about the optical image.

Optical sensors are widely used in digital still cameras, security cameras, medical, automobile, and other applications. Currently, the technology used to manufacture image sensors (e.g. complementary metal-oxide-semiconductor (CMOS) image sensors (CIS)) and image quality, have continued to advance at a great pace.

While existing optical sensors have been generally adequate for their intended purposes, they have not been satisfactory in all respects. There is a particular need for further improvements in the light sensitivity of optical sensors.

SUMMARY

In one embodiment of the present disclosure, an optical sensor is provided, wherein the optical sensor includes a substrate, a first well, a second well, a third well, a deep trench isolation structure, and a passivation layer. The substrate has a first conductivity type and includes a sensing region. The first well is disposed in the sensing region, wherein the first well has a second conductivity type that is different from the first conductivity type and a first depth. The second well is disposed in the sensing region, wherein the second well has the second conductivity type and a second depth. The third well is disposed in the sensing region, wherein the third well has the first conductivity type and a third depth. The deep trench isolation structure is disposed in the substrate and surrounding the sensing region, wherein a depth of the deep trench isolation structure is greater than the first depth, the first depth is greater than the second depth, and the second depth is greater than the third depth. The passivation layer is disposed over the substrate, wherein the passivation layer includes a plurality of protruding portions disposed directly above the sensing region.

In one embodiment of the present disclosure, a method for forming an optical sensor is provided, wherein the method includes: providing a substrate having a first conductivity type, wherein the substrate comprises a sensing region; forming a first well in the sensing region, wherein the first well has a second conductivity type that is different from the first conductivity type and a first depth; forming a second well in the sensing region, wherein the second well has the second conductivity type and a second depth; forming a third well in the sensing region, wherein the third well has the first conductivity type and a third depth; forming a deep trench isolation structure in the substrate and surrounding the sensing region, wherein a depth of the deep trench isolation structure is greater than the first depth, the first depth is greater than the second depth, and the second depth is greater than the third depth; and forming a passivation layer over the substrate, wherein the passivation layer comprises a plurality of protruding portions disposed directly above the sensing region.

BRIEF DESCRIPTION OF THE DRAWINGS

Aspects of this disclosure are best understood from the following detailed description when read with the accompanying figures. It should be noted that, in accordance with common practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the subject matter provided. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "over", "below," "lower," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented and the spatially relative descriptors used herein may likewise be interpreted accordingly.

The terms "about", "approximately", and "substantially" used herein generally refer to the value of an error or a range within 20 percent, preferably within 10 percent, and more preferably within 5 percent, within 3 percent, within 2 percent, within 1 percent, or within 0.5 percent. If there is no specific description, the values mentioned are to be regarded as an approximation that is an error or range expressed as "about", "approximate", or "substantially".

Although some embodiments are discussed with operations performed in a particular order, these operations may be performed in another logical order. Additional features can be provided to the optical sensors in embodiments of the present disclosure. Some of the features described below can be replaced or eliminated for different embodiments.

The optical sensor provided in the embodiments of present disclosure includes a deep trench isolation structure surrounding a sensing region (so-called photodiode region) in a substrate and a passivation layer including a plurality of protruding portions disposed directly above the sensing region. By the arrangement of the deep trench isolation structure and the passivation layer along with adjusting a shape of the protruding portions of the passivation layer (e.g. pyramid, cone, or trapezoidal prism), after incident lights passing through the protruding portions, the incident lights are more dispersed in the sensing region which is surrounded by the deep trench isolation structure to increase the length of transmission paths, thereby improving the quantum efficiency (QE) of the optical sensor.

Figure 1:
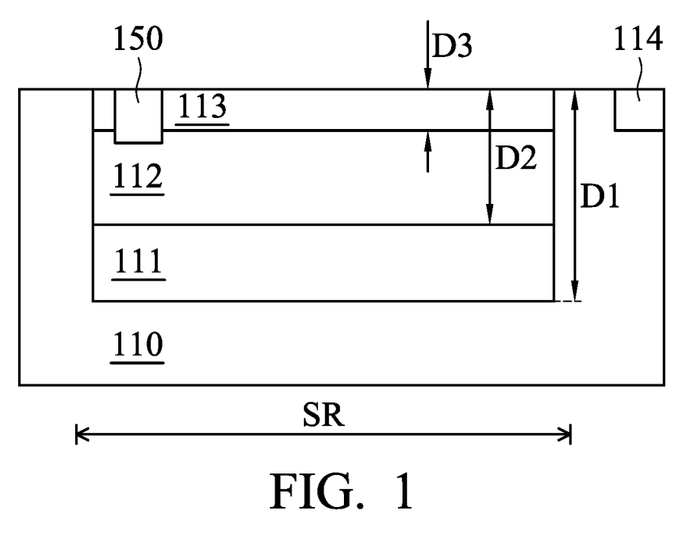
FIGS. 1-5 are cross-sectional views illustrating various steps in the process of manufacturing an optical sensor, according to some embodiments of the present disclosure.
Figure 3:
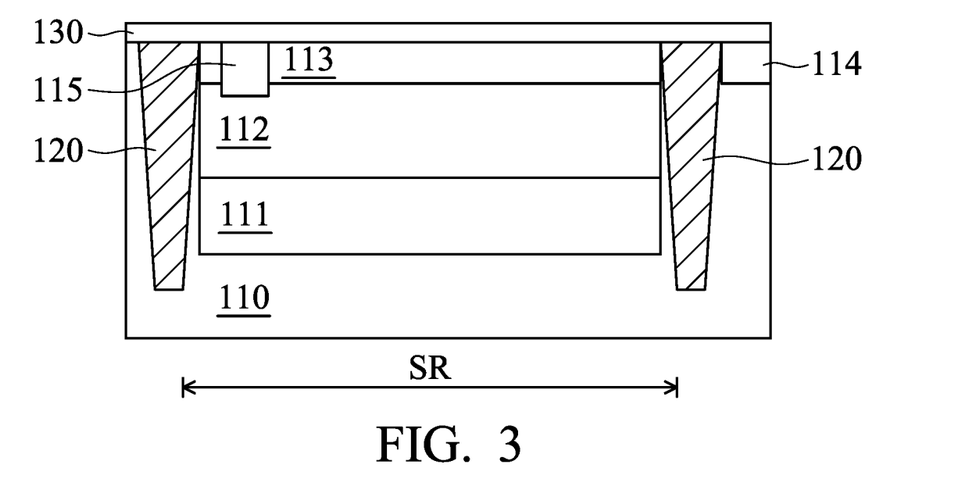
Figure 4:
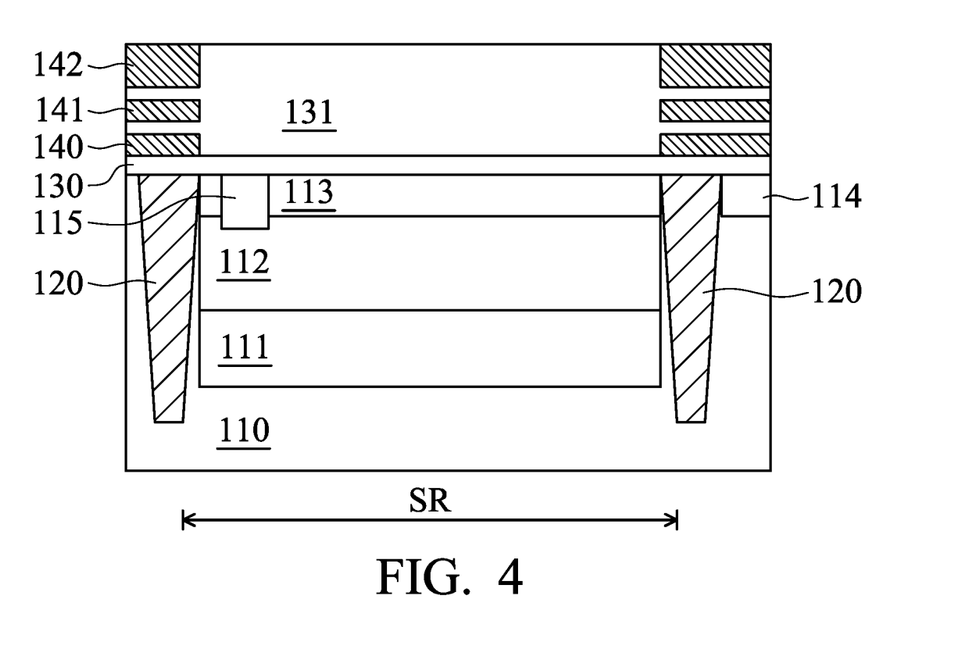
Figure 5:
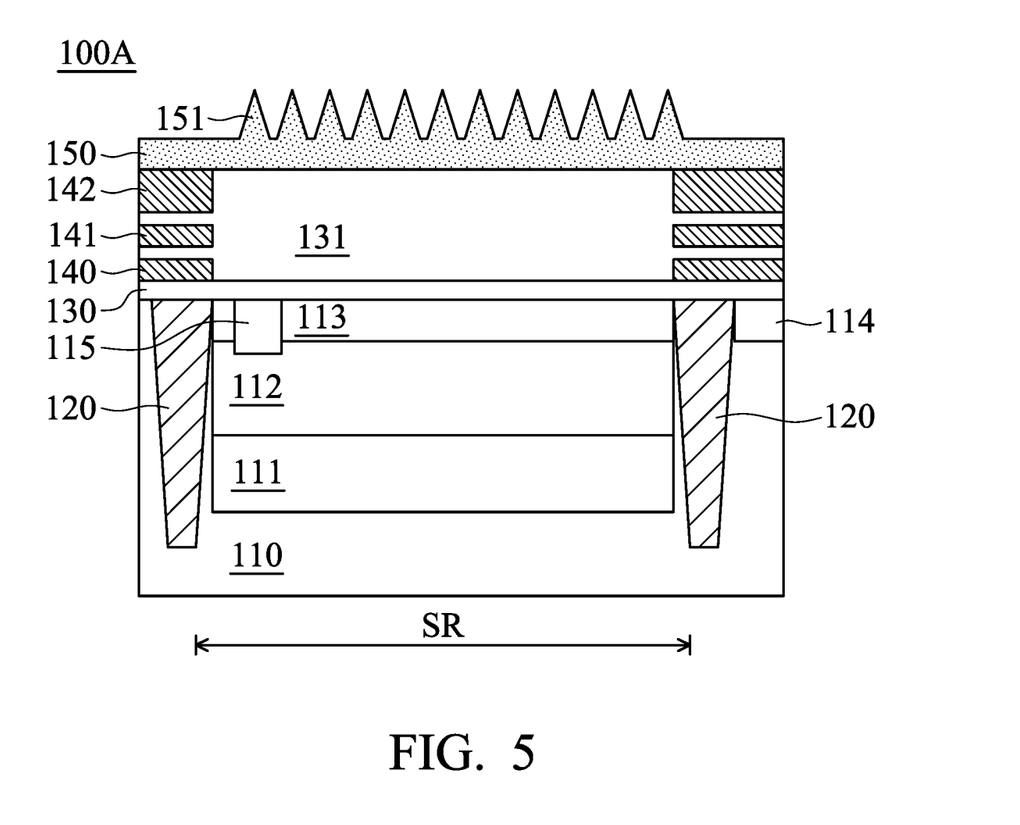

FIGS. 1-5 are cross-sectional views illustrating various steps in the process of manufacturing an optical sensor 100A shown in FIG. 5, according to some embodiments of the present disclosure. Referring to FIG. 1, the optical sensor 100A includes a substrate 110 having a sensing region SR, a first well 111, a second well 112, and a third well 113 formed in the sensing region SR, a first heavily doped region 114 formed on the outer side of the sensing region SR, and a second heavily doped region 115 formed on the inner side of the sensing region SR.

In some embodiments, the substrate 110 may be a semiconductor substrate, such as a silicon substrate. In other embodiments, the semiconductor substrate may also be an elemental semiconductor including germanium, a compound semiconductor including gallium nitride, silicon carbide, gallium arsenide, gallium phosphide, indium phosphide, indium arsenide, and/or indium antimonide, an alloy semiconductor including SiGe, GaAsP, AlInAs, AlGaAs, GaInAs, GaInP, and/or GaInAsP, or a combination thereof. In other embodiments, the substrate 110 may also be a semiconductor on insulator substrates, the semiconductor on insulator substrates may include a substrate, a buried oxide layer disposed on the substrate, and a semiconductor layer disposed on the buried oxide layer. In addition, according to some embodiments of the present disclosure, the conductivity type of the substrate 110 may be a first conductivity type, such as P-type, and the dopants of which may, for example, be B, Al, Ga, In, $BF_3^+$ ions, or a combination thereof, wherein the dopant concentration is in a range from about $1.0 \times 10^{20}/cm^3$ to about $1.0 \times 10^{19}/cm^3$.

Still referring to FIG. 1, in some embodiments, the first well 111, the second well 112, and the third well 113 may be formed in the sensing region SR by an ion implantation process and/or a diffusion process. In some embodiments, the first well 111 has a second conductivity type which is opposite to the first conductivity type. For example, the second conductivity type may be N-type, and the dopants of which may, for example, be N, P, As, Sb ions, or a combination thereof, wherein the dopant concentration is in a range from about $1.0 \times 10^{17}/cm^3$ to about $1.0 \times 10^{20}/cm^3$. The first well 111 has a first depth D1 in a range from about 1.5 micrometers (um) to about 4 um. In the above-mentioned embodiments, the second well 112 may also have the second conductivity type (e.g. N-type), wherein the dopant concentration may be lower than the dopant concentration of the first well 111, such as in a range from about $1.0 \times 10^{15}/cm^3$ to about $1.0 \times 10^{18}/cm^3$. The second well 112 has a second depth D2 which is less than the first depth D1, wherein the second depth D2 is in a range from about 0.3 um to about 1.5 um. In the above-mentioned embodiments, the third well 113 has the first conductivity type (e.g. P-type), and the dopants of which may, for example, be B, Al, Ga, In, $BF_3^+$ ions, or a combination thereof, wherein the dopant concentration is about $1.0 \times 10^{15}/cm^3$. The third well 113 has a third depth D3 which is less than the second depth D2, wherein the third depth D3 is in a range from about 0.1 um to about 1 um. It should be understood that, in other embodiments, the first conductivity type may also be N-type, and the second conductivity type may be P-type.

According to some embodiments of the present disclosure, by the arrangement of the conductivity types, the dopant concentration, and the depth of the substrate 110, the first well 111, the second well 112, and the third well 113, several p-n junctions may be formed in the sensing region SR with different depths in the substrate 110, such as the junction between the substrate 110 and the first well 111, and the junction between the second well 112 and the third well 113.

Since the substrate 110 has different absorption depths for incident lights with different wavelengths, for example, invisible lights with long wavelength (wavelength greater than 700 nanometers (nm)) compared to visible lights (wavelength in a range from about 400 nm to 700 nm) can be incident more deeply into the silicon substrate. Therefore, the depths of the plurality of p-n junctions may be adjusted by the above arrangement to correspond to incident lights with a large wavelength range, and the incident lights can be converted into electrons and holes at the p-n junctions with different depths, thereby generating a current signal and improving the quantum efficiency (QE) of the optical sensor 100A. It should be noted that the depths and the number of the p-n junctions included in the embodiments of the present disclosure may be adjusted according to the product design, and are not limited thereto.

Still referring to FIG. 1, in some embodiments, the first heavily doped region 114 on the outer side of the sensing region SR and the second heavily doped region 115 on the inner side of the sensing region SR may be formed by an ion implantation process and/or a diffusion process. The first heavily doped region 114 and the second heavily doped region 115 thus formed are both adjacent to the top surface of the substrate 110 and may be in electrical connections with electrodes (not shown) formed subsequently to facilitate detecting the current signal produced by the incident lights in the sensing region SR. In some embodiments, the first heavily doped region 114 has the first conductivity type (e.g. P-type), wherein the dopant concentration is in a range from about $1.0 \times 10^{17}/cm^3$ to about $1.0 \times 10^{19}/cm^3$. The second heavily doped region 115 has the second conductivity type (e.g. N-type), wherein the dopant concentration is in a range from about $1.0 \times 10^{17}/cm^3$ to about $1.0 \times 10^{19}/cm^3$.

Figure 2:
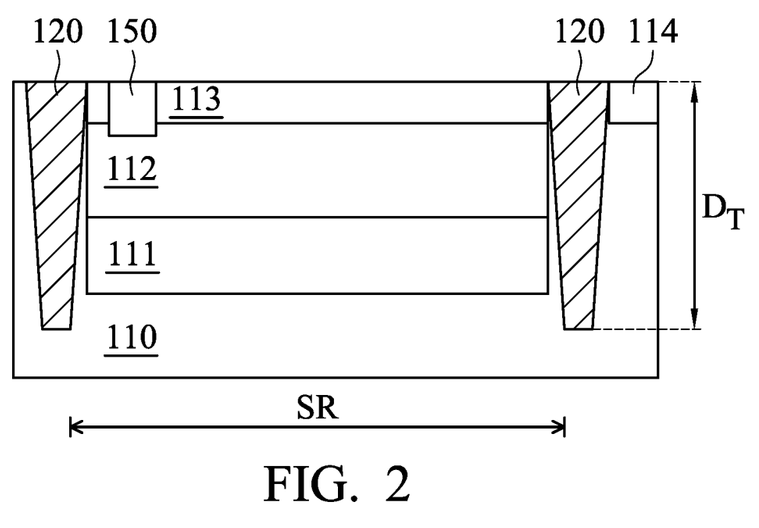

FIG. 2 illustrating a schematic cross-sectional view for forming a deep trench isolation (DTI) structure 120 in the optical sensor 100A, according to some embodiments of the present disclosure. Referring to FIG. 2, the deep trench isolation structure 120 is formed in the substrate 110 and surrounding the sensing region SR. The formation of the deep trench isolation structure 120 includes performing a lithography process and an etching process to the substrate 110 at first to form a deep trench surrounding the sensing region SR (not shown). Subsequently, a high-reflectivity material is filled in the deep trench to form the deep trench isolation structure 120. In some embodiments, the high-reflectivity material is polysilicon. In other embodiments, the high-reflectivity material may also be Al, Cu, W, Ti, other suitable materials, or a combination thereof. The deep trench isolation structure 120 provided in the embodiments of the present disclosure has a depth $D_T$ in a range from about 12 um to about 25 um, and has an aspect ratio in a range from about 0.8 to about 1.6. In some embodiments, the depth $D_T$ of the deep trench isolation structure 120 is greater than the first depth D1, the second depth D2, and the third depth D3 such that each of the p-n junctions in the sensing region SR is surrounded by the deep trench isolation structure 120.

According to some embodiments of the present disclosure, since the deep trench isolation structure 120 has high-reflectivity conductive material (e.g. polysilicon), by the arrangement of the deep trench isolation structure 120 surrounding the sensing region SR, the incident lights may be confined in the sensing region SR into which they are incident to avoid crosstalk between adjacent sensing regions (not shown) to increase transmission paths of the incident lights in the sensing region SR, thereby improving the quantum efficiency (QE) of the optical sensor 100A.

FIG. 3 is a schematic cross-sectional view illustrating forming an inter-layer dielectric layer 130 on the substrate 110, according to some embodiments of the present disclosure. As shown in FIG. 3, the inter-layer dielectric (ILD) layer 130 is disposed on the substrate 110 and covers the third well 113, the first heavily doped region 114, the second heavily doped region 115, and the deep trench isolation structure 120. In some embodiments, the material of the inter-layer dielectric layer 130 may include single layer or multi-layers of dielectric materials, such as silicon oxide, silicon nitride, silicon oxynitride, tetraethoxysilane (TEOS), phosphosilicate glass (PSG), borophosphosilicate glass (BPSG), low-k dielectric materials, and/or other suitable dielectric materials. The low-k dielectric materials may include fluorinated silica glass (FSG), hydrogen silsesquioxane (HSQ), carbon-doped silicon oxide, amorphous fluorinated carbon, parylene, bis-benzocyclobutenes (BCB), or polyimide, but not limited thereto. In some embodiments, the material of the inter-layer dielectric layer 130 may include dielectric materials with dielectric constant in a range from about 3.7 to about 4.2, and a transmittance for incident lights ranging from about 92% to about 98%. Thus, the inter-layer dielectric layer 130 does not substantially affect the penetration of incident lights. For example, a deposition process, such as spin coating, chemical vapor deposition (CVD), physical vapor deposition (PVD), atomic layer deposition (ALD), high density plasma CVD (HDPCVD), other suitable methods, or a combination thereof, may be used to form the inter-layer dielectric layer 130.

FIG. 4 is a schematic cross-sectional view illustrating forming a first metal layer 140, a second metal layer 141, and a third metal layer 142 on the inter-layer dielectric layer 130, and forming an inter-metal dielectric layer 131 between the metal layers, according to some embodiments of the present disclosure. As shown in FIG. 4, the first metal layer 140 formed on the inter-layer dielectric layer 130 and the second metal layer 141 and the third metal layer 142 formed on the inter-metal dielectric layer 131 are adjacent to the sensing region SR. In some embodiments, the first metal layer 140, the second metal layer 141, and the third metal layer 142 may include Cu, W, Ag, Sn, Ni, Co, Cr, Ti, Pb, Au, Bi, Sb, Zn, Zr, Mg, In, Te, Ga, other suitable metallic materials, an alloy thereof, or a combination thereof. In some embodiments, a physical vapor deposition (PVD) process, a plating process, an atomic layer deposition (ALD) process, other suitable processes, or a combination thereof may be used to blanketly form the metal layers on the inter-layer dielectric layer 130 and in the inter-metal dielectric layer 131. In addition, in some embodiments, a damascene process may be used to form the patterned first, second, and third metal layer 140, 141, and 142. According to some embodiments of the present disclosure, the materials and the methods for forming the inter-metal dielectric layer 131 may be those of the inter-layer dielectric layer 130, and the inter-metal dielectric layer 131 does not substantially affect the penetration of incident lights. Although only a single layer of inter-metal dielectric layer 131 is illustrated herein, it may include one or more single or multiple layers of dielectric material. It should be noted that the number of the metal layers illustrated in FIG. 4 is merely exemplary, and the embodiments of the present disclosure are not limited thereto.

FIG. 5 is a schematic cross-sectional view illustrating forming a passivation layer 150 and a plurality of protruding portions 151 included therein on the substrate 110, according to some embodiments of the present disclosure. As shown in FIG. 5, the passivation layer 150 is formed on the third metal layer 142 and the inter-metal dielectric layer 131, wherein the plurality of protruding portions 151 are formed directly on the sensing region SR. According to some embodiments of the present disclosure, the material of the passivation layer 150 includes silicon nitride, and the passivation layer 150 may be formed on the third metal layer 142 and the inter-metal dielectric layer 131 by a deposition process, such as spin coating, chemical vapor deposition (CVD), physical vapor deposition (PVD), atomic layer deposition (ALD), high density plasma CVD (HDPCVD), other suitable methods, or a combination thereof.

Subsequently, a patterning process is performed to the material of the passivation layer (e.g. silicon nitride) disposed on the third metal layer 142 and the inter-metal dielectric layer 131 to form the plurality of protruding portions 151 in a specific shape (e.g. pyramid, cone, or trapezoidal prism), wherein the tips of the protruding portions 151 are directed away from the substrate 110. The patterning process includes forming a patterned photoresist layer (not shown) on the material of the passivation layer by a photolithography process, and performing an etching process to the material of the passivation layer through a plurality of openings of the patterned photoresist layer (not shown) to form the passivation layer 150 and the plurality of protruding portions 151 directly on the sensing region SR. Specifically, the above-mentioned etching process may include a dry etching process (e.g. reactive ion etching (RIE)) or other suitable etching processes, and etching conditions (e.g. gas flow rate) may be controlled to adjust the shape of the protruding portions 151 thus formed. In some embodiments, by adjusting the etching conditions, the thickness of the protruding portions 151 may be adjusted to be in a range from about 1000 angstroms (Å) to about 3000 angstroms.

Figure 6A:
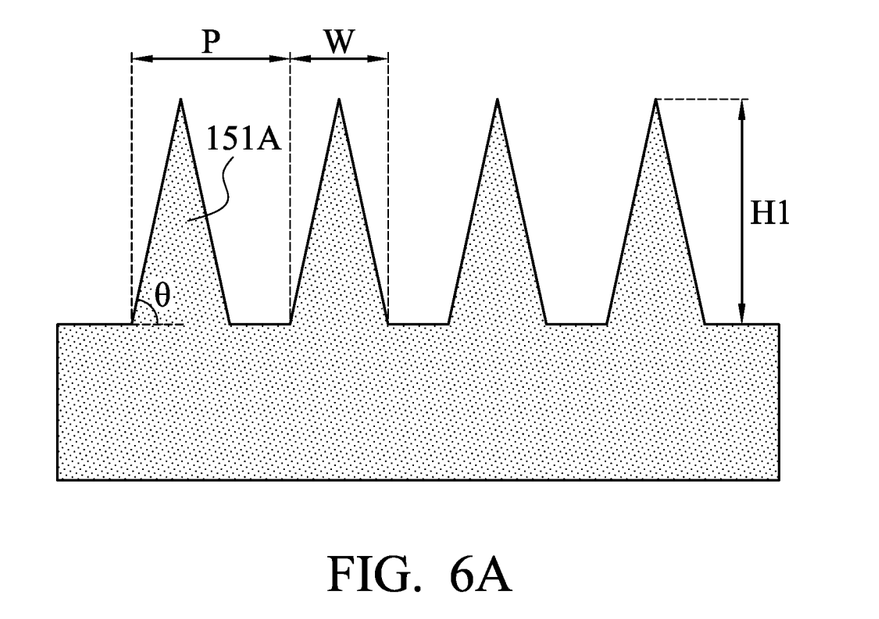
FIGS. 6A and 6B are partial enlarged cross-sectional views illustrating an arrangement of a passivation layer of an optical sensor, according to some embodiments of the present disclosure.
Figure 6B:
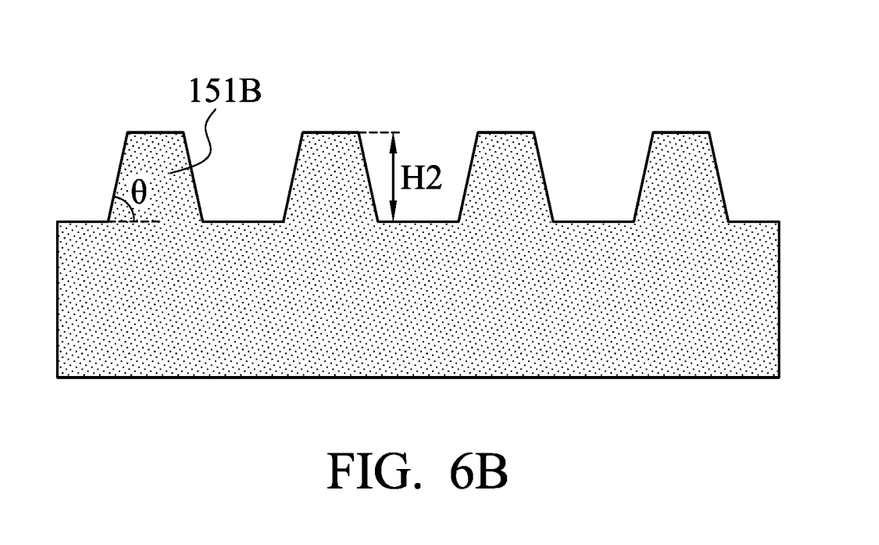

Still referring to FIG. 5 along with FIGS. 6A and 6B. FIGS. 6A and 6B are partial enlarged cross-sectional views illustrating an arrangement of a plurality of protruding portions 151A and 151B included in the passivation layer 150 of the optical sensor 100A. As shown in FIG. 6, the shapes of the protruding portions 151A in the cross-sectional view are isosceles triangles, wherein the bottom angle θ of which is in a range from about 38 degrees to about 65 degrees, such as about 55 degrees. However, it should be understood that the three-dimensional shape of the protruding portions 151A may be a pyramid or a cone (not shown). In some embodiments, the protruding portions 151A have a pitch P in a range from about 0.8 um to about 1.2 um, such as 1 um. One of the protruding portions 151A has a width W in a range from about 0.74 um to about 0.93 um, such as 0.83 um. One of the protruding portions 151A has a height H1 in a range from about 0.45 um to about 0.76 um, such as 0.7 um.

As shown in FIG. 6B, the shapes of the protruding portions 151B in the cross-sectional view are isosceles trapezoids. It should be understood that the three-dimensional shape of the protruding portions 151B may be a trapezoidal prism (not shown). According to some embodiments of the present disclosure, one of the protruding portions 151B has a height H2 in a range from about 0.22 um to about 0.38 um, such as about 0.30 um. However, the values for the bottom angle θ, the pitch P, and the width W of the protruding portions 151B in the cross-sectional view may be consistent with the above-mentioned parameters of the protruding portions 151A. The details are not described again herein to avoid repetition.

It should be noted that the shapes, number, and parameters of the protruding portions provided herein are merely exemplary and may be adjusted according to product design, and the present disclosure is not limited thereto. Furthermore, the protruding portions 151A and 151B described with respect to FIGS. 6A and 6B are not limited to be applicable to the optical sensor 100A, which are also applicable to optical sensors 100B, 100C, and 100D that will be discussed later.

Referring back to FIG. 5, the optical sensor 100A includes the deep trench isolation structure 120 surrounding the sensing region SR in the substrate 110 and the passivation layer 150 including the plurality of protruding portions 151 disposed directly above the sensing region SR. According to some embodiments of the present disclosure, the passivation layer 150 may be used to protect the underlying structures in the subsequent processes or operations. Furthermore, by the arrangement of the passivation layer 150 along with the shape and geometrical sizes of the protruding portions 151 (e.g. the protruding portions 151A or 151B) of the passivation layer 150, the incident lights may be refracted and/or diffracted as they pass through the protruding portions 151, such that the incident lights are more dispersed in the sensing region SR which is surrounded by the deep trench isolation structure 120 to increase the lengths of the transmission paths, thereby enhancing the quantum efficiency (QE) of the optical sensor 100A.

Figure 7:
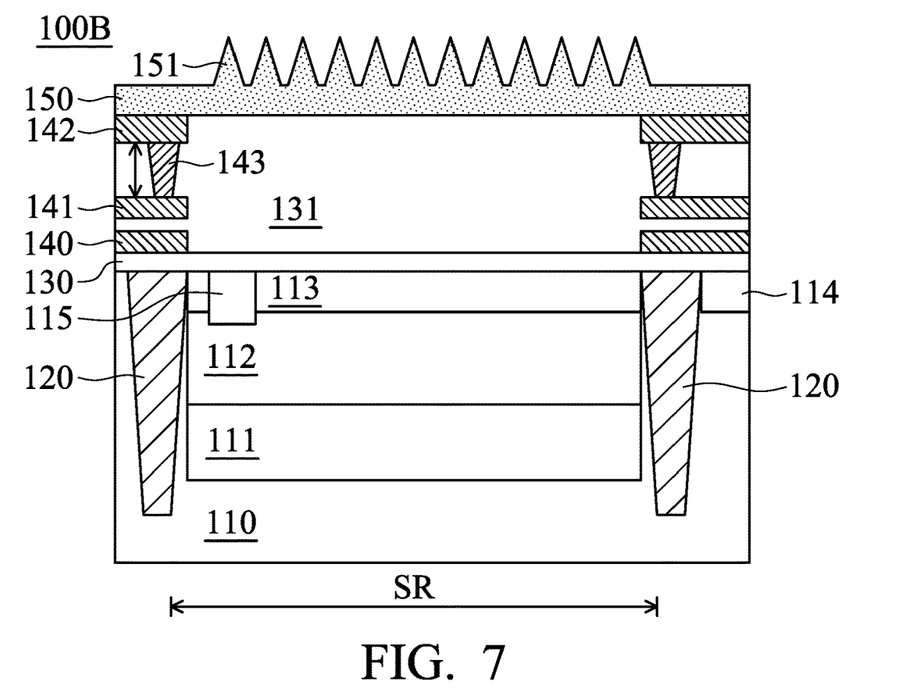
FIG. 7 is a cross-sectional view illustrating an optical sensor, according to other embodiments of the present disclosure.

FIG. 7 is a cross-sectional view illustrating the optical sensor 100B, according to other embodiments of the present disclosure. As shown in FIG. 7, the structure of the optical sensor 100B is substantially the same as the structure of the optical sensor 100A illustrated in FIG. 5, and the difference therebetween is that the optical sensor 100B further includes a plurality of metal vias 143 disposed between the second metal layer 141 and the third metal layer 142 and buried in the inter-metal dielectric layer 131. In the embodiments, the plurality of metal vias 143 are closely adjacent to the boundary of the sensing region SR or disposed on the boundary of the sensing region SR. The material of the plurality of metal vias 143 includes W, and the plurality of metal vias 143 may be formed by a single damascene process or a dual damascene process together with the second metal layer 141. The details are not described again herein to avoid repetition. In other embodiments, the material of the plurality of metal vias 143 may also be selected from the conductive materials mentioned above for forming the first, second, and third metal layer 140, 141, and 142.

Still referring to FIG. 7, according to some embodiments of the present disclosure, the space between the second metal layer 141 and the third metal layer 142 is greater than the space between the first metal layer 140 and the second metal layer 141. In the embodiments, a portion of the inter-metal dielectric layer 131 between the second metal layer 141 and the third metal layer 142 has a thickness T (i.e. the space between the second metal layer 141 and the third metal layer 142) greater than a thickness of a portion of the inter-metal dielectric layer 131 between the first metal layer 140 and the second metal layer 141 (i.e. the space between the first metal layer 140 and the second metal layer 141). In some embodiments, the thickness T may be in a range from about 0.7 um to about 1.1 um. According to some embodiments of the present disclosure, since the metal vias 143 have high-reflectivity conductive material (e.g. W), by disposing metal vias 143 in the thicker portions of the inter-metal dielectric layer 131 and closely adjacent to the boundary of the sensing region SR, the reflection space of the incident lights can be increased, thereby increasing the transmission paths of incident lights in the sensing region SR.

Figure 8:
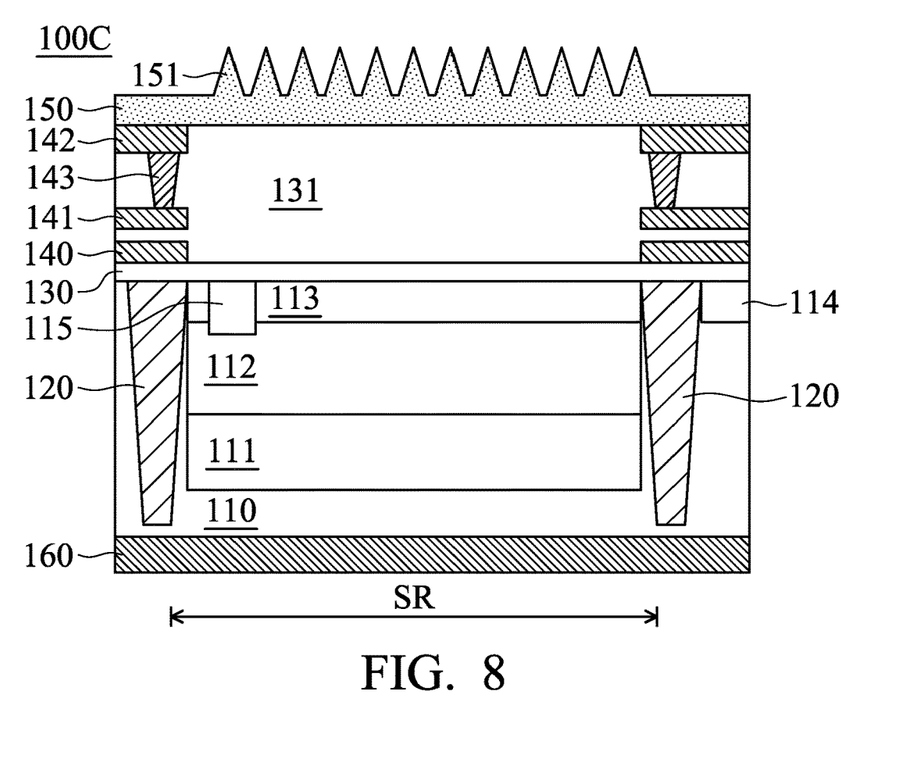
FIG. 8 is a cross-sectional view illustrating an optical sensor, according to other embodiments of the present disclosure.

FIG. 8 is a cross-sectional view illustrating the optical sensor 100C, according to other embodiments of the present disclosure. As shown in FIG. 8, the structure of the optical sensor 100C is substantially the same as the structure of the optical sensor 100B illustrated in FIG. 7, and the difference therebetween is that the optical sensor 100C further includes a metal bottom layer 160 disposed under a bottom surface of the substrate 110, wherein a projection of a bottom surface of the sensing region SR on the bottom surface of the substrate 110 is not beyond the metal bottom layer 160. In some embodiments, the metal bottom layer 160 attached under the bottom surface of the substrate 110 may, for example, be a metal line layer or a metal substrate, which may include Cu, Al, Au, W, a combination thereof, or other suitable metallic materials with high-reflectivity. According to some embodiments of the present disclosure, since the metal bottom layer 160 includes high-reflectivity metallic material, by providing the arrangement of the metal bottom layer 160, the reflection paths of the incident lights can be increased, and the incident lights can be more effectively confined in the sensing region SR of the substrate 110. It should be noted that the metal bottom layer 160 described with respect to FIG. 8 is not limited to be applicable to the optical sensor 100C, which are also applicable to the optical sensor 100A and the optical sensor 100D that will be discussed later.

Figure 9:
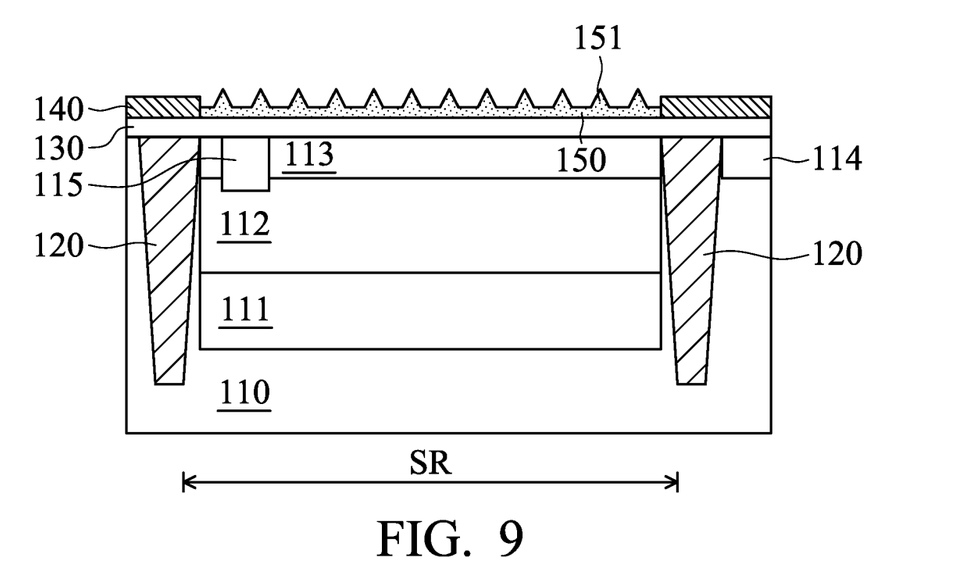
FIGS. 9-13 are cross-sectional views illustrating various steps in the process of manufacturing an optical sensor, according to other embodiments of the present disclosure.
Figure 10:
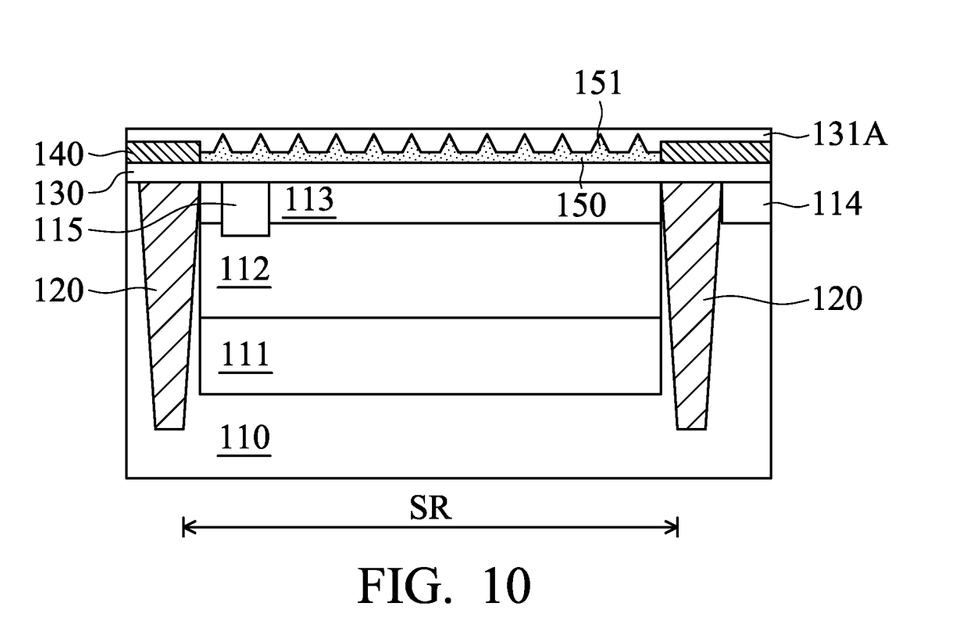
Figure 11:
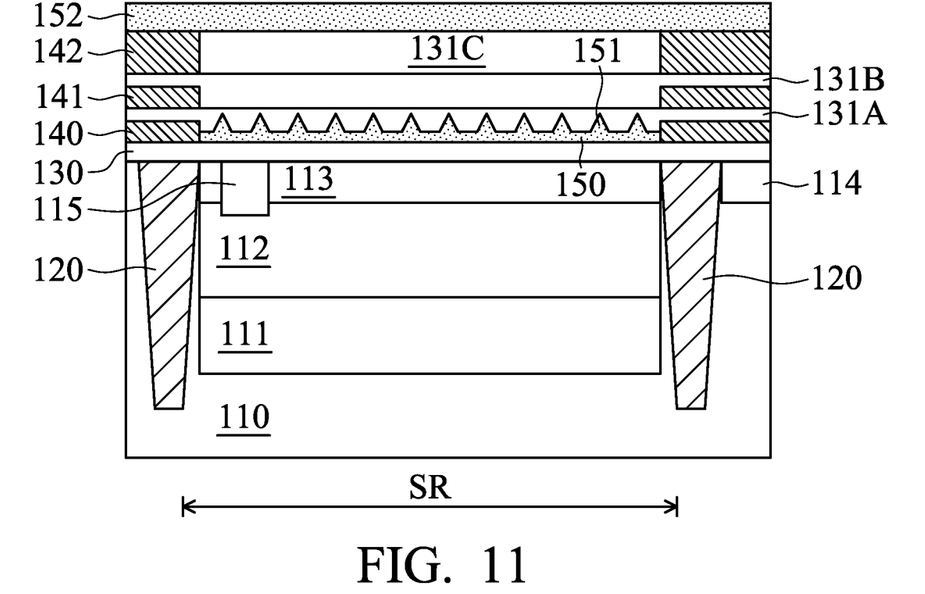
Figure 12:
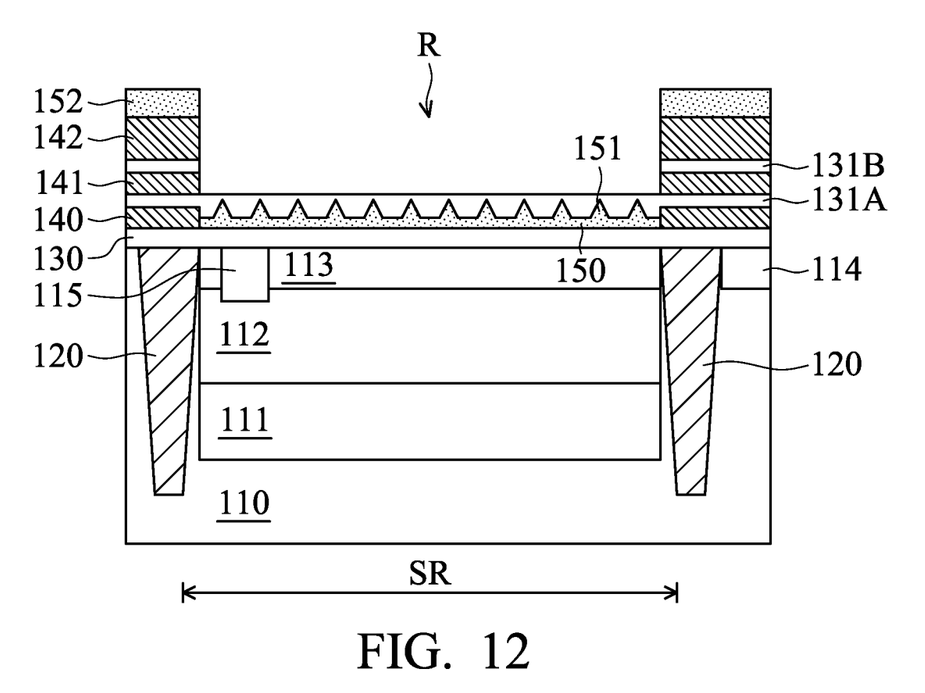
Figure 13:
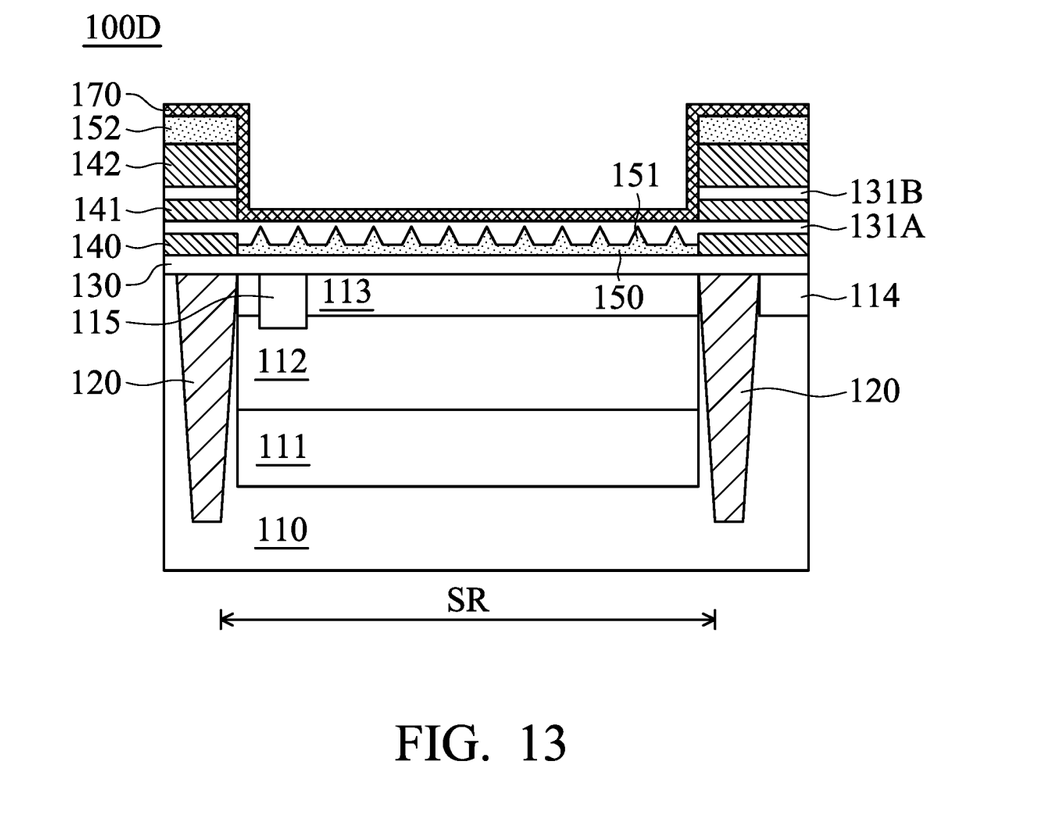

FIGS. 9-13 are cross-sectional views illustrating various steps in the process of manufacturing an optical sensor 100D which is shown in FIG. 13, according to other embodiments of the present disclosure. The structure illustrated in FIG. 9 may be formed sequentially after the formation of the inter-layer dielectric layer 130 on the substrate 110 as illustrated in FIG. 3. Referring to FIG. 9, a first metal layer 140 and a passivation layer 150 having a plurality of protruding portions 151 are directly formed on the inter-layer dielectric layer 130, wherein the passivation layer 150 is disposed directly above the sensing region SR. Subsequently, referring to FIG. 10, a first inter-metal dielectric layer 131A is formed on the first metal layer 140 and covers the passivation layer 150.

Referring to FIG. 11, after the formation of the first metal layer 140, a second metal layer 141, an second inter-metal dielectric layer 131B, a third metal layer 142, and a third inter-metal dielectric layer 131C are sequentially formed on the first inter-metal dielectric layer 131A, wherein the bottom surface of the second metal layer 141 thus formed is higher than the plurality of protruding portions 151 included in the passivation layer 150. It should be noted that the number of the metal layers and the inter-metal dielectric layers illustrated in FIG. 11 are merely exemplary and may be adjusted depending on product design, and the embodiments of the present disclosure are not limited thereto. Still referring to FIG. 11, a passivation layer 152 is sequentially formed on the topmost metal layer (e.g. the third metal layer 142) and the topmost inter-metal dielectric layer (e.g. the third inter-metal dielectric layer 131C) to be advantageous to protect the underlying structures.

Referring to FIG. 12, a patterning process is performed to form a recess R directly above the sensing region SR and exposing the first inter-metal dielectric layer 131A. In some embodiments, the patterning process may include a photolithography process and an etching process. The photolithography process may include photoresist coating (e.g. spin-coating), soft baking, exposure, post-exposure baking, photoresist developing, rinsing and drying (e.g. hard baking), other suitable processes, or a combination thereof. The etching process may include such as a wet etching process, a dry etching process, other suitable etching processes, or a combination thereof. In some embodiments, the etch chemistry used in the wet etching process may include a diluted solution of hydrofluoric acid (HF) with a buffer, such as ammonium fluoride ($NH_4F$), diluted HF ($HF/H_2O$), phosphoric acid ($H_3PO_4$), sulfuric acid with deionized water ($H_2SO_4/H_2O$), or any combination thereof. In some embodiments, the etch chemistry used in the dry etching process may include a fluorocarbon based chemistry (e.g. fluorinated hydrocarbons), such as tetrafluoromethane ($CF_4$), trifluromethane ($CHF_3$), or the like. In some embodiments, a patterned photoresist (not shown) is formed on the passivation layer 152 by a photolithography process, and an etching step is performed to the passivation layer 152 and the underlying first/second inter-metal dielectric layer 131A/131B through an opening (not shown) of the patterned photoresist to form the recess R directly above the sensing region SR and exposing the first inter-metal dielectric layer 131A.

Subsequently, referring to FIG. 13, after the above-mentioned etching step, a protective layer 170 is conformally deposited on the top surfaces of the passivation layer 152 and the first inter-metal dielectric layer 131A and the sidewall surfaces of the second metal layer 141, the second inter-metal dielectric layer 131B, and the third metal layer 142 to protect the structures above covered by the protective layer 170. In some embodiments, the protective layer 170 may be a resist protective oxide (RPO). The formation method of the protective layer 170 may be chemical vapor deposition (CVD) or other suitable processes. The material of the protective layer 170 may include silicon dioxide, silicon nitride, silicon oxynitride, or other suitable dielectric materials. According to some embodiments of the present disclosure, the thickness of the protective layer 170 formed by the above-mentioned methods may be in a range from about 500 angstroms (Å) to about 1500 angstroms. The protective layer 170 with an appropriate thickness can effectively protect the structure it covers (e.g. the sidewall surfaces of the second/third metal layer 141/142) without affecting the penetration of incident light into the passivation layer 150 to the sensing region SR.

Still referring to FIG. 13, the optical sensor 100D includes the deep trench isolation structure 120 surrounding the sensing region SR in the substrate 110 and the passivation layer 150 including the plurality of protruding portions 151 disposed directly above the sensing region SR and directly formed on the inter-layer dielectric layer 130. By the arrangement of the passivation layer 150 closely adjacent to the sensing region SR along with the shape and geometrical sizes of the protruding portions 151 (e.g. the protruding portions 151A or 151B) of the passivation layer 150, the incident lights may be refracted and/or diffracted as they pass through the protruding portions 151, such that the incident lights are more dispersed in the sensing region SR which is surrounded by the deep trench isolation structure 120 to increase the lengths of the transmission paths, thereby enhancing the quantum efficiency (QE) of the optical sensor 100D.

As described above, the optical sensor provided in the embodiments of present disclosure includes a deep trench isolation structure surrounding a sensing region (so-called photodiode region) in a substrate and a passivation layer including a plurality of protruding portions disposed directly above the sensing region. By the arrangement of the deep trench isolation structure and the passivation layer (e.g. disposed on the metal layer or on the inter-layer dielectric layer) along with adjusting a shape of the protruding portions of the passivation layer (e.g. pyramid, cone, or trapezoidal prism), after incident lights passing through the protruding portions, the incident lights are more dispersed in the sensing region which is surrounded by the deep trench isolation structure to increase the length of transmission paths, thereby improving the quantum efficiency (QE) of the optical sensor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An optical sensor, comprising:
   a substrate having a first conductivity type, wherein the substrate comprises a sensing region;
   a first well disposed in the sensing region, wherein the first well has a second conductivity type that is different from the first conductivity type and a first depth;
   a second well disposed in the sensing region, wherein the second well has the second conductivity type and a second depth;
   a third well disposed in the sensing region, wherein the third well has the first conductivity type and a third depth;
   a deep trench isolation structure disposed in the substrate and surrounding the sensing region, wherein a depth of the deep trench isolation structure is greater than the first depth, the first depth is greater than the second depth, and the second depth is greater than the third depth; and
   a passivation layer disposed over the substrate, wherein the passivation layer comprises a plurality of protruding portions disposed directly above the sensing region and a projection of the plurality of protruding portions on the substrate is confined between opposite edges of the deep trench isolation structure.

2. The optical sensor as claimed in claim 1, further comprising:
an inter-layer dielectric layer disposed on the substrate and below the passivation layer; and
a first metal layer disposed on the inter-layer dielectric layer and adjacent to the sensing region.

3. The optical sensor as claimed in claim 2, further comprising:
an inter-metal dielectric layer disposed on the first metal layer; and
a second metal layer disposed on the inter-metal dielectric layer and adjacent to the sensing region, wherein the passivation layer is disposed on the second metal layer.

4. The optical sensor as claimed in claim 2, further comprising:
an inter-metal dielectric layer disposed on the first metal layer; and
a second metal layer disposed on the inter-metal dielectric layer and adjacent to the sensing region, wherein the passivation layer is disposed directly on the inter-layer dielectric layer, and the plurality of protruding portions of the passivation layer are lower than a bottom surface of the second metal layer.

5. The optical sensor as claimed in claim 1, further comprising:
a first heavily doped region having the first conductivity type disposed in the substrate, wherein the first heavily doped region is disposed on an outer side of the sensing region and adjacent to a top surface of the substrate; and
a second heavily doped region having the second conductivity type disposed in the sensing region, wherein the second heavily doped region is disposed on an inner side of the sensing region and adjacent to the top surface of the substrate.

6. The optical sensor as claimed in claim 1, wherein the depth of the deep trench isolation structure is in a range from 12 um to 25 um.

7. The optical sensor as claimed in claim 1, wherein a shape of the plurality of protruding portions of the passivation layer is a pyramid, a cone, or a trapezoidal prism.

8. The optical sensor as claimed in claim 1, wherein in a cross-sectional view, a bottom angle of the shape of the plurality of protruding portions of the passivation layer is in a range from 38 degrees to 65 degrees.

9. The optical sensor as claimed in claim 3, further comprising:
a plurality of metal vias disposed between the first metal layer and the second metal layers and buried in the inter-metal dielectric layer, wherein the plurality of metal vias are closely adjacent to a boundary of the sensing region.

10. The optical sensor as claimed in claim 1, further comprising:
a metal bottom layer disposed under a bottom surface of the substrate, wherein a projection of a bottom surface of the sensing region on the bottom surface of the substrate is not beyond the metal bottom layer.

11. A method for forming an optical sensor, comprising:
providing a substrate having a first conductivity type, wherein the substrate comprises a sensing region;
forming a first well in the sensing region, wherein the first well has a second conductivity type that is different from the first conductivity type and a first depth;
forming a second well in the sensing region, wherein the second well has the second conductivity type and a second depth;
forming a third well in the sensing region, wherein the third well has the first conductivity type and a third depth;
forming a deep trench isolation structure in the substrate and surrounding the sensing region, wherein a depth of the deep trench isolation structure is greater than the first depth, the first depth is greater than the second depth, and the second depth is greater than the third depth; and
forming a passivation layer over the substrate, wherein the passivation layer comprises a plurality of protruding portions disposed directly above the sensing region and a projection of the plurality of protruding portions on the substrate is confined between opposite edges of the deep trench isolation structure.

12. The method as claimed in claim 11, further comprising:
before forming the passivation layer, forming an inter-layer dielectric layer on the substrate, and the forming of the passivation layer comprising forming the passivation layer on the inter-layer dielectric layer; and
forming a first metal layer on the inter-layer dielectric layer and adjacent to the sensing region.

13. The method as claimed in claim 12, further comprising:
forming an inter-metal dielectric layer on the first metal layer; and
forming a second metal layer on the inter-metal dielectric layer and adjacent to the sensing region, wherein the passivation layer is disposed on the second metal layer.

14. The method as claimed in claim 11, further comprising:
forming a first heavily doped region in the substrate, wherein the first heavily doped region is disposed on an outer side of the sensing region and adjacent to a top surface of the substrate and has the first conductivity type; and
forming a second heavily doped region in the sensing region, wherein the second heavily doped region is disposed on an inner side of the sensing region and adjacent to the top surface of the substrate and has the second conductivity type.

15. The method as claimed in claim 11, wherein the depth of the deep trench isolation structure is in a range from 12 um to 25 um.

16. The method as claimed in claim 11, wherein forming the passivation layer comprises forming the plurality of protruding portions in a shape of a pyramid, a cone, or a trapezoidal prism by a patterning process.

17. The method as claimed in claim 16, wherein in a cross-sectional view, a bottom angle of the shape of the plurality of protruding portions of the passivation layer formed by the patterning process is in a range from 38 degrees to 65 degrees.

18. The method as claimed in claim 13, further comprising:
forming a plurality of metal vias between the first metal layer and the second metal layer and buried in the inter-metal dielectric layer, wherein the plurality of metal vias are closely adjacent to a boundary of the sensing region.

19. The method as claimed in claim 11, further comprising:
  providing a metal bottom layer under a bottom surface of the substrate, wherein a projection of a bottom surface of the sensing region on the bottom surface of the substrate is not beyond the metal bottom layer.

20. The method as claimed in claim 12, further comprising:
  after forming the first metal layer, forming the passivation layer directly on the inter-layer dielectric layer;
  forming a first inter-metal dielectric layer on the first metal layer and covering the passivation layer;
  forming a second metal layer on the first inter-metal dielectric layer, wherein a bottom surface of the second inter-metal dielectric layer is higher than the plurality of protruding portions of the passivation layer;
  forming a second inter-metal dielectric layer on the second metal layer; and
  performing an etching process to form a recess directly above the sensing region and exposing the first inter-metal dielectric layer.

\* \* \* \* \*